United States Patent [19]

Fedele

[11] Patent Number: 4,813,056
[45] Date of Patent: Mar. 14, 1989

[54] MODIFIED STATISTICAL CODING OF DIGITAL SIGNALS

[75] Inventor: Nicola J. Fedele, Kingston, N.J.

[73] Assignee: General Electric Company, Schenectady, N.Y.

[21] Appl. No.: 130,379

[22] Filed: Dec. 8, 1987

[51] Int. Cl.$^4$ .............................................. H04N 7/12
[52] U.S. Cl. ...................................... 375/27; 375/122; 341/107
[58] Field of Search .................... 375/27, 30, 122, 25; 358/133, 135, 261; 382/56; 340/347 DD

[56] References Cited

U.S. PATENT DOCUMENTS

| | | | |
|---|---|---|---|
| 4,121,259 | 10/1978 | Preuss et al. | 340/347 DD |
| 4,185,302 | 1/1980 | Mounts et al. | 358/261 |
| 4,232,338 | 11/1980 | Netravali et al. | 358/136 |
| 4,297,727 | 10/1981 | Ogawa et al. | 358/261 |
| 4,302,775 | 11/1981 | Widergren et al. | 358/136 |
| 4,420,771 | 12/1983 | Pirsch | 358/261 |
| 4,460,923 | 7/1984 | Hirano et al. | 358/136 |
| 4,482,886 | 11/1984 | Tsugane | 358/135 |
| 4,562,468 | 12/1985 | Koga | 358/136 |
| 4,563,671 | 1/1986 | Lim et al. | 358/261 |
| 4,578,704 | 3/1986 | Gharvi | 358/135 |
| 4,610,027 | 9/1986 | Anderson et al. | 358/261 |
| 4,706,265 | 11/1987 | Furukawa | 358/133 |

OTHER PUBLICATIONS

"Adaptive Intra-Interframe DPCM Coder" by P. Pirsch, published in May-Jun. 1982 issue of Bell System Technical Journal, pp. 747-764.

*Primary Examiner*—Benedict V. Safourek
*Assistant Examiner*—Stephen Chin
*Attorney, Agent, or Firm*—William Squire; James C. Davis, Jr.; Paul R. Webb, II

[57] ABSTRACT

A ROM includes a single dictionary of variable length codewords wherein Huffman codewords are assigned all members of the dictionary set, including one key codeword being assigned as a prefix codeword segment for a relatively large subgroup of the set, based on the combined probability of occurrence of the subgroup as compared to the individual probabilities of occurrences of the remaining members of the dictionary set. The key codeword is an indication of a departure from straightforward Huffman coding, to prepare an alternative coding scheme for developing a longer codeword which uses the key codeword as a prefix portion of that longer codeword. A unique suffix codeword segment follows the key codeword prefix for particularly identifying each member of the subgroup. The combined probability of occurrence of a member of the subgroup is higher than the probability of occurrence of codewords of shorter length, but the individual probabilities are significantly lower. The subgroup members can be assigned codeword lengths significantly shorter than codewords that would be assigned in straightforward Huffman coding.

23 Claims, 4 Drawing Sheets

MODIFIED STATISTICAL CODING OF DIGITAL SIGNALS

This invention relates to encoders for encoding digital signals wherein certain values of signals have a higher frequency of occurrence than other values. Transmission systems for digital signals include a number of signal processing functions which may include quantizers, predictive schemes, encoders for encoding digitized signals, buffers and control circuitry among others. Sometimes the term "encoder" as used in this art refers to the entire transmission system and at other times the term "encoder" refers merely to the encoding function of a coder circuit within the transmission system. The present invention relates to the latter.

Of interest are copending applications Ser. No. 158,171 filed Feb. 19, 1988 entitled "DECODER FOR DIGITAL SIGNAL CODES" in the name of R. Hingorani and N. J. Fedele, Ser. No. 63,044 filed June 17, 1987 entitled "Parameterized Variable-length Coding" in the name of B. Astle and S. J. Golin and Ser. No. 127,335 filed Dec. 1, 1987 entitled "DPCM System with Adaptive Quantizer Having Unchanging Bin Number Ensemble" in the name of A. A. Acampora and U.S. Pat. No. 4,706,260 all assigned to the assignee of the present invention.

Where the bandwidth available in the transmission channel is limited, it is desirable to compress to as large extent as possible video data to be transmitted. Numerous schemes have evolved for increasing the efficiency of such compression during transmission while not introducing too intrusive reduction in image quality. For example, one kind of system known as differential pulse code modulation (DPCM) employs a predictive scheme for predicting pixel values of a video picture. The predicted information is compared to the actual information based on spatial or temporal relationships, and an error signal is generated representing the differences between the two information signals. The error signals are further reduced in information content by more coarsely quantizing them—that is, by classifying them into range bins. The coarser quantization is done so as to tend to make the range bin in which the lowest output value digital signals fall the one most frequently selected in the classification procedure and the range bins of successively higher output value digital signal ones less frequently selected than the ranges of lower values. The more coarsely quantized information is then encoded using codewords of variable bit length, which are chosen so their length is inversely related to the frequency that the bins they describe tend to be selected during the classification into range bins. This procedure is known as statistical coding.

Huffman has described procedures for describing variable length codes optimally. Further improvements in coding efficiency can be obtained by treating certain runs of successive bin values that are all alike differently from other bin values. Runs of certain length and value that are likely to occur can be classified as special cases and included in the statistical coding procedure, to be accorded short bit length codewords reflective of their tendency to frequently occur. This implies that signals having large run lengths may be converted to relatively short codewords which drastically increase the efficiency of the transmission system.

In information signals wherein a relatively large proportion of the information being transmitted is redundant and exhibits relatively little error from one block of information to a second block, the error signals tend to exhibit relatively long zero run lengths. By way of example, in a video signal transmitting picture information, a given 2.2 MHz image scan line has 240 active pixels. The resultant error signal in a predictive system thus can have zero run lengths of up to 240 zeros in a given scan line representing a still picture for that scan line and n non-zero levels outputted by the quantizer representing different degrees of motion. The result is a potential of over 240 different codewords being required to accurately represent the information signal. The problem is how to effectively deal with such numerous codes.

One solution to this problem is presented in U.S. Pat. No. 4,420,771 in which multiple tables are provided by run length encoding the information signal employing multiple dictionaries. The multiple tables, however, use identical codewords representing different information signals. The use of the same codewords to represent different information signals requires additional overhead to indicate to the receiver which table is employed. The addition of even one bit of additional information as overhead in the transmission system can have significant effects in reducing the efficiency of transmission.

For example, if the most frequently occurring information sample (pixel) is encoded with a 2-bit codeword, the addition of a single bit for that most frequently occurring codeword decreases the transmission efficiency of that codeword by 50%, and defeats the purpose of making the most frequently occurring codewords as short as possible. Other schemes employ different versions of variable length and run length encoding in an attempt to increase the efficiency of data transmission. However, certain of these suffer similar drawbacks in also requiring additional overhead between the transmitter and receiver, detracting from the system efficiency or generating codewords that may be excessively long. Hardware employed in the latter kinds of systems tend to increase in cost as the number of bits in a codeword increase, thus making the hardware at the transmitter and receiver more complex and more costly.

One approach to increasing system efficiency is to adaptively quantize the information prior to the coding process. However, the coarse quantizing process has a tendency, by definition, to reduce the information quality as compared to the original information signal. While the quantizer does increase efficiency, it tends to permanently eliminate information bits from the data signal which is generally to be avoided, if possible. A need is seen, therefore, for a solution to the problem of increasing transmission efficiency, i.e., provide increased compression, without detracting from the information signal quality and without employing excessively long codewords. To this extent, the present invention is directed to a more efficient coder which can provide relatively high compression using codewords of minimum length as compared to the total number of different codewords employed.

According to the present invention, a plurality of different codewords of different code lengths are grouped into first and second groups wherein each codeword represents a different signal condition in an information signal. These signal conditions may, for example, be descriptive of (a) non-zero values of the information signal after coarse quantization, and (b) of more frequently encountered run lengths of zero values of the information signal after coarse quantization. The first group of the codewords are organized in a first given order in which, at least generally, the shortest codeword length manifests that signal condition having the greatest probability of occurrence and the greatest codeword length manifests that signal condition having the lowest probability of occurrence. The first group of codewords, for example, may include a key codeword that signals a change in the coding procedure from statistical coding using the first group of codewords to the use of a different coding scheme using a codeword drawn from the second group of codewords. Each codeword in the second group, in this example, may include the key codeword as a prefix codeword segment followed by a suffix codeword segment. The second group of different codewords individually have respective low probabilities of occurrence, and it is the combined probability of their occurrences that determines the position of the key codeword in the first given order. Members of the second group of codewords on an average have a bit length which is significantly shorter than would otherwise occur for codewords assigned codeword lengths according to simple statistical coding. The second group of codewords may be of uniform bit length and by way of example describe less commonly encountered run length of non-zero values of the information signal after coarse quantization.

Figure 1:
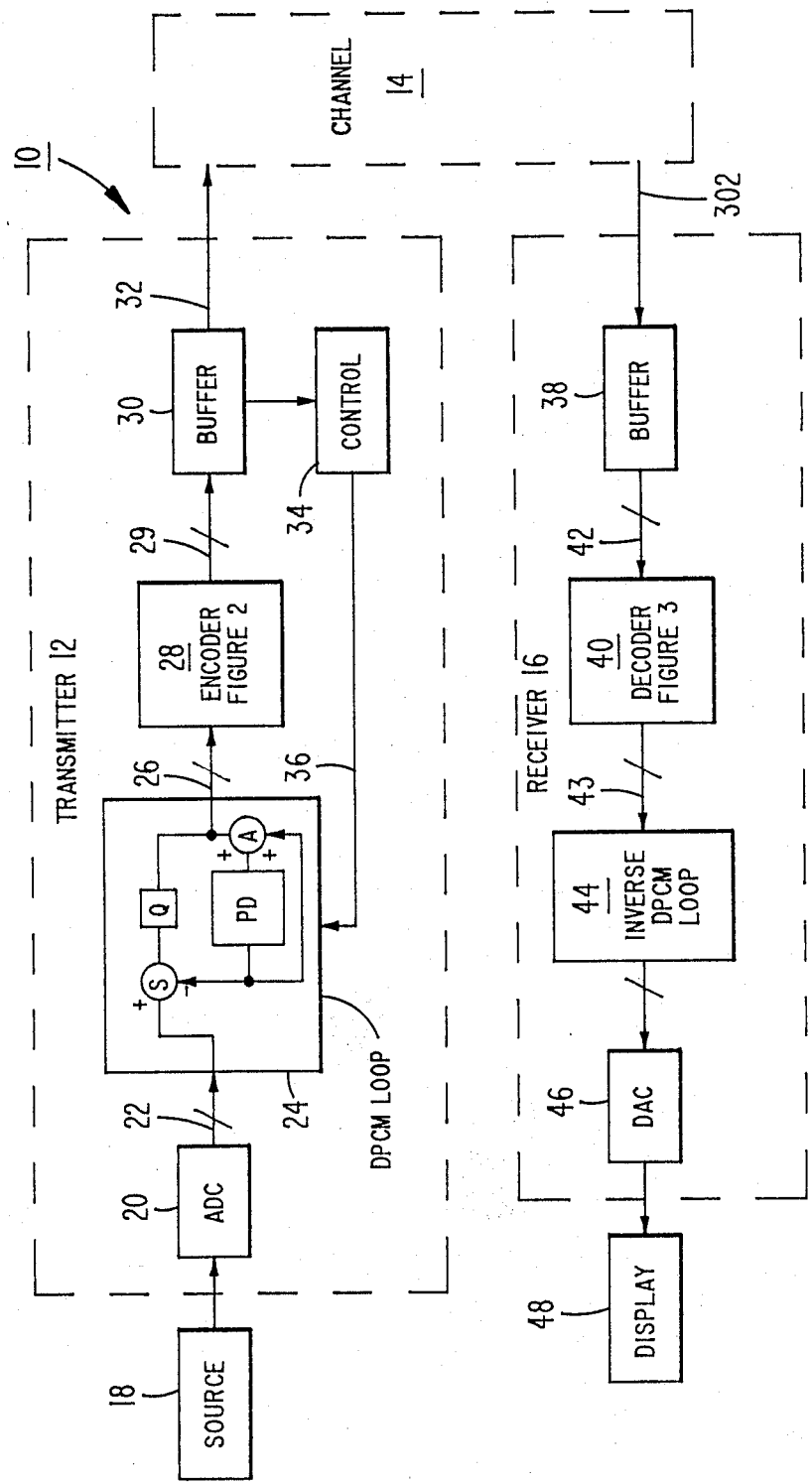
FIG. 1 is a block diagram of a transmission system employing an encoder according to one embodiment of the present invention.

In FIG. 1, system 10 comprises a transmitter 12, a channel 14 over which the transmitter 12 transmits and a receiver 16. By way of example, the transmitter 12 and receiver 16 are described as a predictive picture encoder employing differential pulse code modulation (DPCM). However, the signals encoded by the coder of the present invention may be derived from sources other than error signals in a predictive system.

In FIG. 1, a source 18 of information signals, for example video, applies the information to an analog-to-digital converter (ADC) 20 which finely quantizes the information signal in a known way to produce a multi-level digital signal. The output of the analog-to-digital converter (ADC) is applied on conductor 22 as an 8-bit pixel signal to a differential pulse code modulator (DPCM) loop 24. The DPCM loop 24 is one that is generally available and well known. It includes, for example, subtractor S for subtracting predicted information signals produced by a predictor and delay loop PD from the finely quanitzed information signal on conductor 22 to produce an error signal. That error signal is applied to a quantizer Q which assigns different values of the input error signal to a reduced number of output values or bins representing zero and non-zero values of the error signal. By way of example, the quantizer Q may have 32 bin values and a zero value, i.e., 32 non-zero values, for a total of 33 different values. The quantizer output values are applied to conductor 26 and adder A. Adder A adds the quantizer Q output signals to the predictor and delay loop PD output and applies the added signals to the predictor and delay loop PD.

Such a DPCM loop may be, for example, as described in U.S. Pat. No. 4,706,260 and in the aforementioned copending application entitled "DPCM System with Adaptive Quantizer Having Unchanging Bin Number Ensemble" in the name of A. A. Acampora, both of which describe prior art DPCM loops in greater detail.

It should be understood that wires representing conductors herein represent either single conductors or multiple conductors for transmitting data signals in parallel as known. The input information signal on conductor 22 to DPCM loop 24 may comprise, for example, an 8 conductor cable for carrying an 8-bit signal.

The output of the DPCM loop 24 is applied to conductor 26 and is an 8-bit signal which represents any of the 33 quantized zero and non-zero values of the information signal. The output of the DPCM loop 24 on conductor 26 is applied to encoder 28 of the present invention which is described in more detail in FIG. 2.

The encoder 28 encodes the output values of loop 24 to generate variable length codewords on conductor 29. The codewords are applied to a buffer 30 sometimes referred to as a rate buffer. The buffer 30 stores the codes for transmission over channel 14 via conductor 32. As known, the buffer 30 tends to overfill and underfill in response to the variable length codewords applied as an input thereto on conductor 29 and has a fixed output rate on conductor 32.

A control 34 senses the fill level of the buffer 30 and applies a control signal on conductor 36 to the DPCM loop 24 for controlling the coarseness of the quantizer Q of the loop 24. As described in the aforementioned U.S. Pat. No. 4,706,260 the quantizer Q may increase the number of zeros produced on conductor 26 i.e., widen the coring region, to reduce the data rate applied to buffer 30 in case of overfill. The case of underfill of the buffer, the control 34 applies a signal on conductor 36 to loop 24 to adaptively change the quantizer so as to increase the data rate to the buffer 30. As is known, the output of the buffer 30 on conductor 32 is at a constant data rate and information must be maintained on conductor 32 at that constant rate regardless of the rate at which buffer 30 fills. All of this information is generally known in the art and is described in more detail, by way of example, in the aforementioned U.S. Pat. No. 4,706,260 and copending application.

The information on conductor 32 is transmitted via channel 14 to receiver 16 where the information signal is received by buffer 38. A decoder 40, described in more detail in FIG. 3, receives the output of buffer 38 on conductor 42 to decode the received information signal. The decoded signal is applied via conductor 43 to inverse DPCM loop 44. The output of loop 44 is applied via digital-to-analog converter (DAC) 46 to a display monitor 48 which displays the information represented by the decoded information signal.

As mentioned above, a coarse quantizer, such as quantizer Q in a DPCM loop such as loop 24 is often inserted in the output of the loop subtractors. The quantizer coarsely quantizes the digitized error signal on conductor 22. Necessarily the error signal is finely quantized prior to the quantizing action of ADC 20. That finely quantized signal may have a relatively large number of different levels in accordance with the information represented by the signal from source 18.

In a video image, there may be as many as 256 different luminance levels at the output of ADC 20. The coarse quantizer Q, reduces the 256 levels of the digitized signal to a significantly smaller number; e.g. 33 as mentioned above. While in the present embodiment, a coarsely quantized signal, having representative few quantized levels, is applied to the encoder 28, the present invention is not so limited and may be applied to any kind of digitized signal.

Figure 4:
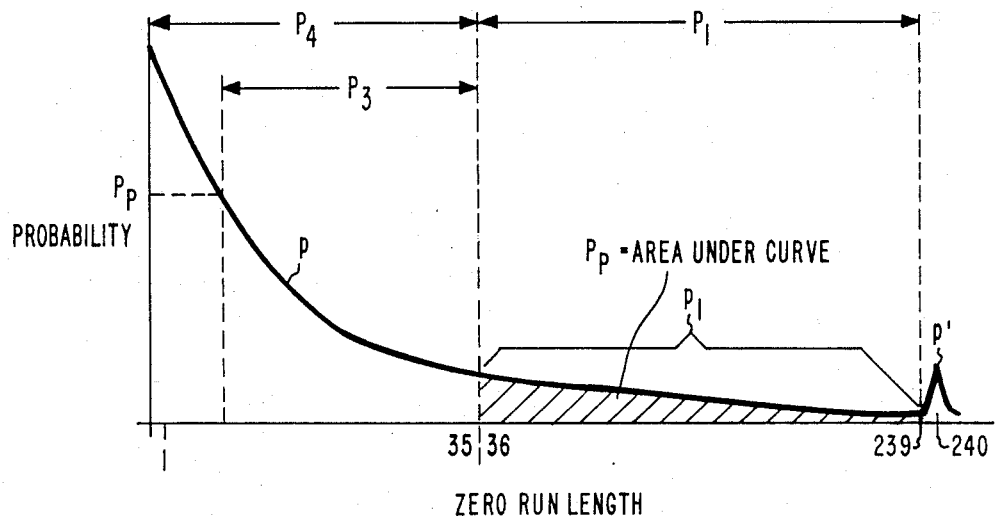
FIG. 4 is a graph useful in explaining some of the principles of the present invention.

In processing video signals, it is characteristic of a system employing an interframe DPCM loop that the most frequently occurring quantized values represent unchanged or zero values. It is statistically known that for certain video frames, as for example, in teleconferencing systems, the majority of the frame information does not change from one frame to the next. Thus, in interframe DPCM, where the predictor delays samples from the previous frame for a frame time are used to predict corresponding samples in the current frame, the resulting error signal tends to contain relatively long zero run lengths. Statistically, it can be shown that runs of zeros of different lengths have different frequencies of occurrence. Considering run length of zeros shorter than a full line, the greater run lengths (for example, run lengths of say 239 pixels representing zero values in a given scan scan line) have relatively low frequency of occurrence. A run length of a single zero pixel value in which the adjacent pixels exhibit non-zero values has a much higher probability of occurrence. These relationships are shown in FIG. 4, for example, where curve p represents the probability of occurrence of zero run lengths ranging from one zero to 240 zeros in a given scan line of a given video frame in a teleconferencing system. The probability of a single zero occurring between two non-zero values has the highest value, whereas the probability of 239 zeros between non-zero values has the lowest value.

The probability, frequency of occurrence, of a scan line having all zeros, that is, having a run length of 240 zeros is higher than the probability of occurrence of a run of 239 zeros. This produces a peak p' in curve p. The peak p' represents an increased probability for the occurrence of run lengths of 240 zeros. This means that scan lines which represent an unchanged picture occur more frequently than scan lines in which a small number of samples, for example, one or two pixels, have changed value while the remaining pixels remain unchanged. Thus, in a typical video signal, the frequency of occurrence of zero run lengths changes significantly from one pixel which remains unchanged between non-zero pixel values to a given 240 pixel scan line which remains unchanged in successive frames.

Normally, to transmit this information over a channel, that is, to transmit the values of the zero run lengths for every possible run length that occurs, becomes a relatively difficult task using conventional hardware systems. Conventional Huffman coding, for example, may result in codewords which have 20 or more bits. Such long codewords tend to cause complexity in the hardware for coding at the transmitter and for decoding at the receiver and cause larger components to be utilized making the system more costly and inefficient. For example, if a system operates most of the time with codewords in the 2 to 7-bit range but nevertheless occasionally operates with 15 or 20-bit codewords, then the hardware for the transmitter and for the receiver must necessarily include a capability to process the 20-bit codeword or the maximum length codeword in the system. This problem is compounded by the fact that predictive systems, by nature, tend to produce a large number of error values which have values at or near zero.

Figure 2:
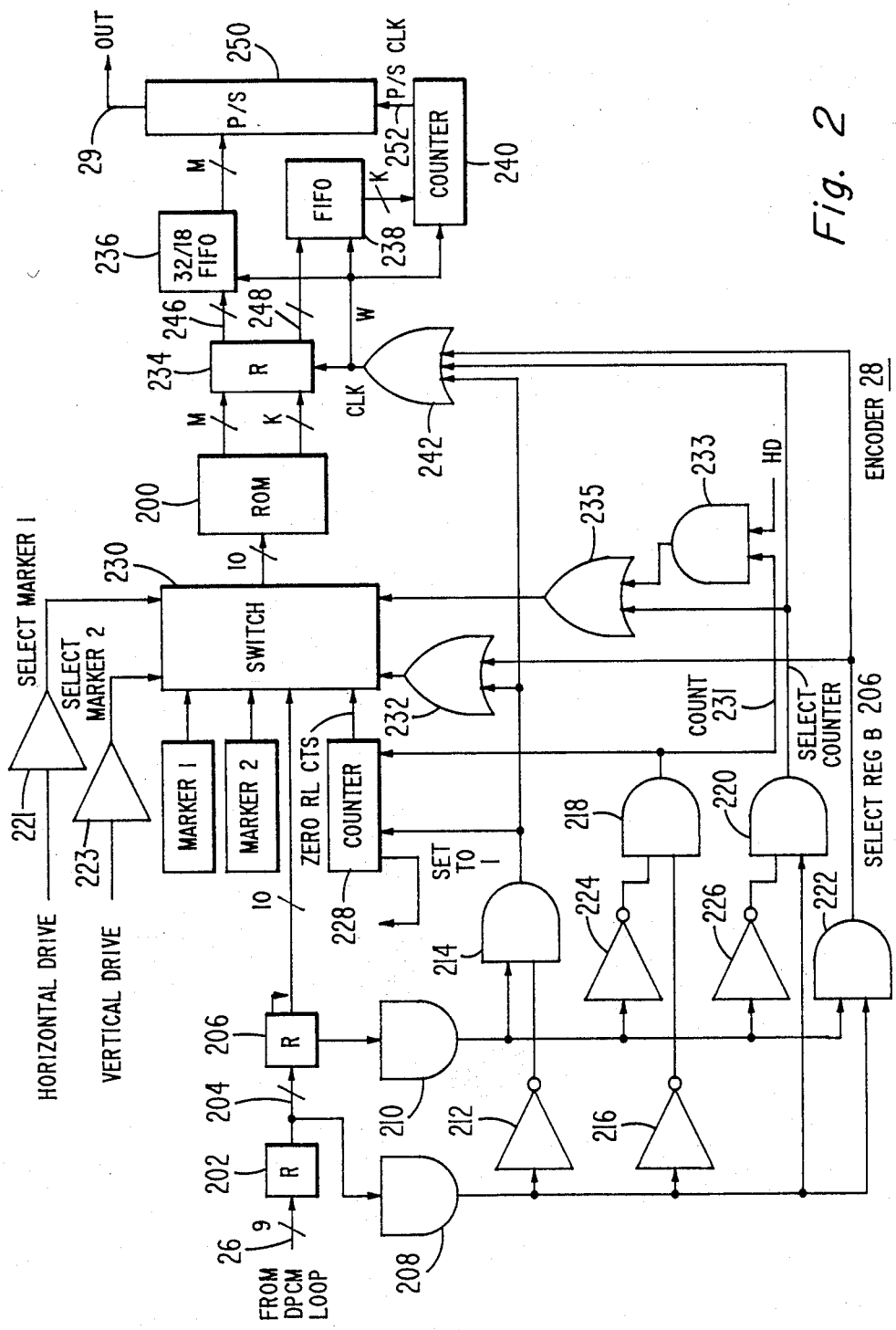
FIG. 2 is a block diagram of the encoder employed in the embodiment of FIG. 1.

In FIG. 2, ROM 200 contains an encoder look up table which is established in accordance with the principles of the present invention. The table stored in ROM 200 is a single table for transmission purposes but is presented below for purposes of description as Tables I, II, III and IV. A single table implies that any portion of the table can be transmitted to the receiver without additional overhead to decipher the table. That is, every member of the table is part of a given encoding scheme in which the rule of encoding, and thus decoding, is transparent to the receiver without using additional overhead. The present encoding arrangement employs a Huffman-like coding rule, for example, but differs from a conventional Huffman code in that significantly shorter codewords are used for a relatively larger number of different codewords of relatively low probability of occurrence.

Table I is a listing of the non-zero values produced by the DPCM loop 24, FIG. 1. There are 32 non-zero values representing 32 output bin values of the quantizer Q of the DPCM loop 24. The non-zero value of −7 represents non-zero values of the quantized error signal of the DPCM loop which lie, for example, in a range of input values of −6 to −10, with a zero value occurring for input signal values in the range of ±5. The code for the non-zero −7 value is labeled code 1. The next most frequencntly occurring non-zero value has a value of +7 and its code is labeled code 1'. Code 1 has a code length of 2-bits whereas code 1' has a code length of 3-bits. Examination of Table I shows that non-zero values which tend to occur less frequently also tend to increase in magnitude and are assigned greater code lengths. The exception is codeword 16' which has a higher probability of occurrence than longer codewords 11–16 and 13'–15'. Therefore the code length for code 16' is shorter than these last mentioned codes.

TABLE I

| CODE NUMBER | CODE LENGTH | CODE MSB | CODE LSB | VALUE |
|---|---|---|---|---|
| 1' | 3 | 11 1 | | 7 |
| 2' | 4 | 10 00 | | 12 |
| 3' | 5 | 10 100 | | 17 |
| 4' | 6 | 11 0101 | | 22 |
| 5' | 6 | 01 0101 | | 27 |
| 6' | 7 | 11 0010 | 1 | 32 |
| 7' | 7 | 11 0011 | 0 | 37 |
| 8' | 7 | 01 1101 | 1 | 45 |
| 9' | 7 | 01 0011 | 1 | 55 |
| 10' | 8 | 01 1110 | 00 | 64 |
| 11' | 8 | 01 0000 | 00 | 74 |
| 12' | 8 | 01 1111 | 00 | 87 |
| 13' | 9 | 01 1110 | 010 | 108 |
| 14' | 9 | 01 0000 | 111 | 130 |
| 15' | 9 | 01 1111 | 101 | 150 |
| 16' | 8 | 01 0000 | 01 | 170 |
| 1 | 2 | 00 | | −7 |
| 2 | 4 | 10 01 | | −12 |
| 3 | 5 | 10 101 | | −17 |
| 4 | 6 | 11 0100 | | −22 |
| 5 | 6 | 01 0100 | | −27 |
| 6 | 7 | 11 0010 | 0 | −32 |
| 7 | 7 | 11 0000 | 1 | −37 |
| 8 | 7 | 01 1100 | 1 | −45 |
| 9 | 7 | 01 0010 | 0 | −55 |
| 10 | 8 | 01 1100 | 01 | −64 |
| 11 | 9 | 01 1111 | 100 | −74 |
| 12 | 9 | 01 1000 | 000 | −87 |
| 13 | 10 | 01 1100 | 0001 | −108 |
| 14 | 10 | 01 1100 | 0000 | −130 |
| 15 | 10 | 01 1100 | 0011 | −150 |

TABLE I-continued

| CODE NUMBER | NON-ZERO VALUES | | | |
|---|---|---|---|---|
| | CODE LENGTH | CODE MSB | LSB | VALUE |
| 16 | 10 | 01 1100 | 0010 | −170 |

TABLE II

| LENGTH OF ZEROS | ZERO RUN LENGTH VALUES | | |
|---|---|---|---|
| | CODE LENGTH | CODE MSB | LSB |
| 1 | 4 | 10 | 11 |
| 2 | 5 | 11 | 011 |
| 3 | 5 | 01 | 101 |
| 4 | 6 | 11 | 0001 |
| 5 | 6 | 01 | 1001 |
| 6 | 6 | 01 | 0001 |
| 7 | 7 | 11 | 0000 0 |
| 8 | 9 | 01 | 0010 110 |
| 9 | 7 | 01 | 0011 0 |
| 10 | 8 | 11 | 0011 11 |
| 11 | 8 | 01 | 1111 01 |
| 12 | 8 | 01 | 1101 01 |
| 13 | 8 | 01 | 1000 01 |
| 14 | 8 | 01 | 0010 10 |
| 15 | 8 | 01 | 0000 10 |
| 16 | 9 | 01 | 1111 111 |
| 17 | 9 | 01 | 1110 111 |
| 18 | 9 | 01 | 1101 001 |
| 19 | 9 | 01 | 1000 001 |
| 20 | 9 | 01 | 0010 111 |
| 21 | 9 | 01 | 0000 110 |
| 22 | 10 | 11 | 0011 1011 |
| 23 | 10 | 01 | 1111 1101 |
| 24 | 10 | 01 | 1110 1101 |
| 25 | 10 | 01 | 1110 1000 |
| 26 | 10 | 01 | 1110 1001 |
| 27 | 10 | 11 | 0011 1000 |
| 28 | 10 | 11 | 0011 1010 |
| 29 | 10 | 01 | 1111 1100 |
| 30 | 10 | 01 | 1110 0110 |
| 31 | 10 | 11 | 0011 1001 |
| 32 | 10 | 01 | 1110 1011 |
| 33 | 10 | 01 | 1101 0001 |
| 34 | 10 | 01 | 1110 1100 |
| 35 | 10 | 01 | 1101 0000 |

TABLE III

| RESERVED AND SPECIAL CODES | | | |
|---|---|---|---|
| CODE LENGTH | CODE MSB | LSB | ASSIGNED SIGNAL |
| 10 | 01 1110 | 1010 | MARKER 1 |
| 10 | 01 1110 | 0111 | MARKER 2 |
| 5 | 01 011 | | KEYWORD |
| 7 | 01 1000 | 1 | 240 CODE |

TABLE VI

| 208 | 210 | 214 | 218 | 220 | 222 |
|---|---|---|---|---|---|
| 0 | 0 | | 1 | | |
| 0 | 1 | 1 | | | |
| 1 | 0 | | | 1 | |
| 1 | 1 | | | | 1 |

TABLE IV

| Length of Zeros | ZERO-RUN LENGTH VALUES Keyword Codes | | | |
|---|---|---|---|---|
| | Code Length | CODE MSB Keyword | | LSB |
| 36 | 13 | 01 | 011000000 | 00 |
| 37 | 13 | 01 | 011100000 | 00 |
| 38 | 13 | 01 | 011010000 | 00 |
| . | . | . | . | . |
| 236 | 13 | 01 | 011000100 | 11 |
| 237 | 13 | 01 | 011100100 | 11 |
| 238 | 13 | 01 | 011010100 | 11 |
| 239 | 13 | 01 | 011110100 | 11 |

TABLE V

NON-ZERO AND ZERO RUN LENGTHS IN ORDER OF PROBABILITY OF OCCURRENCE

| Probability Order of Occurrence | Non-zero Value (Quantizer Output) | Run Length Value | Code Length | Code |
|---|---|---|---|---|
| 1 | −7 | | 2 | 00 |
| 2 | 7 | | 3 | 111 |
| 3 | −12 | | 4 | 1001 |
| 4 | | 1 | 4 | 1011 |
| 5 | 12 | | 4 | 1000 |
| 6 | −17 | | 5 | 10101 |
| 7 | 17 | | 5 | 10100 |
| 8 | | 2 | 5 | 11011 |
| 9 | | 3 | 5 | 01101 |
| 10 | keyword | | 5 | 01011x$_1$ ... x$_n$ |
| 11 | −22 | | 6 | 110100 |
| 12 | −27 | | 6 | 010100 |
| 13 | 22 | | 6 | 110101 |
| 14 | 27 | | 6 | 010101 |
| 15 | | 4 | 6 | 110001 |
| 16 | | 5 | 6 | 011001 |
| 17 | | 6 | 6 | 010001 |
| 18 | −32 | | 7 | 1100100 |
| 19 | 32 | | 7 | 1100101 |
| 20 | −37 | | 7 | 1100001 |
| 21 | 37 | | 7 | 1100110 |
| 22 | −45 | | 7 | 0111001 |
| 23 | 45 | | 7 | 0111011 |
| 24 | −55 | | 7 | 0100100 |
| 25 | 55 | | 7 | 0100111 |
| 26 | | 7 | 7 | 1100000 |
| 27 | | 9 | 7 | 0100110 |
| 28 | | 240 | 7 | 0110001 |
| 29 | −64 | | 8 | 01110001 |
| 30 | 64 | | 8 | 01111000 |
| 31 | 74 | | 8 | 01000000 |
| 32 | 87 | | 8 | 01111100 |
| 33 | | 10 | 8 | 11001111 |
| 34 | | 11 | 8 | 01111101 |
| 35 | | 12 | 8 | 01110101 |
| 36 | | 13 | 8 | 01100001 |
| 37 | | 14 | 8 | 01001010 |
| 38 | | 15 | 8 | 01000010 |
| 39 | 170 | | 8 | 01000001 |
| 40 | −74 | | 9 | 011111100 |
| 41 | −87 | | 9 | 011000000 |
| 42 | 180 | | 9 | 011110010 |
| 43 | 130 | | 9 | 010000111 |
| 44 | 150 | | 9 | 011111101 |
| 45 | | 8 | 9 | 010010110 |
| 46 | | 16 | 9 | 011111111 |
| 47 | | 17 | 9 | 011110111 |
| 48 | | 18 | 9 | 011101001 |
| 49 | | 19 | 9 | 011000001 |
| 50 | | 20 | 9 | 010010111 |
| 51 | | 21 | 9 | 010000110 |
| 52 | Marker 1 | | 10 | 0111101010 |
| 53 | Marker 2 | | 10 | 0111100111 |
| 54 | −108 | | 10 | 0111000001 |
| 55 | −130 | | 10 | 0111000000 |
| 56 | −150 | | 10 | 0111000011 |
| 57 | −170 | | 10 | 0111000010 |
| 58 | | 22 | 10 | 1100111011 |
| 59 | | 23 | 10 | 0111111101 |

TABLE V-continued
NON-ZERO AND ZERO RUN LENGTHS IN ORDER OF PROBABILITY OF OCCURRENCE

| Probability Order of Occurrence | Non-zero Value (Quantizer Output) | Run Length Value | Code Length | Code |
|---|---|---|---|---|
| 60 | | 24 | 10 | 0111101101 |
| 61 | | 25 | 10 | 0111101000 |
| 62 | | 26 | 10 | 0111101001 |
| 63 | | 27 | 10 | 1100111000 |
| 64 | | 28 | 10 | 1100111010 |
| 65 | | 29 | 10 | 0111111100 |
| 66 | | 30 | 10 | 0111100110 |
| 67 | | 31 | 10 | 1100111001 |
| 68 | | 32 | 10 | 0111101011 |
| 69 | | 33 | 10 | 0111010001 |
| 70 | | 34 | 10 | 0111101100 |
| 71 | | 35 | 10 | 0111010000 |

In FIG. 4, curve p represents the probability of occurrence of zero run lengths. Zero run lengths having values in the range from 1-35, curve p portion $p_4$, for example, have relatively higher probability of occurrence as compared to run lengths of 36-239, curve p portion $p_1$. The run lengths of 1-35 have an area under the curve p, portion $p_4$ which is about 85% of the area under the entire curve p. The probability of occurrence of zero run lengths between 36 and 239 zeros decreases gradually as shown by curve p portion $p_1$. The combined probability of occurrence $p_p$ of all run lengths corresponds to the area under curve portion $p_1$ is a fraction of the area under curve p. Probability $p_p$ represents a relatively small portion of the area under the entire probability curve p excluding zero run length 240. The area under curve portion $p_1$ represents about 15% of the area under all of curve p, by way of example.

The zero run lengths in portion $p_4$ are illustrated in Table II and the run lengths of portion $p_1$ are illustrated in Table IV. Zero run lengths having a probability of occurrence lower than the combined probability $p_p$ occur in curve portion $p_3$. The probability of occurrence $p_p$ of any member of the group in portion $p_1$ of the curve p is higher than the probability of occurrence of any one of the zero run lengths in portion $p_3$ of the curve p. The probability of occurrence of zero run length values in portion $p_4$ are listed in Table V based upon order of probability of occurrence for non-zero values and for zero run lengths having values of 1-35, in this example. The zero run length values and non-zero values are combined in a single table organized according to probability of occurrence. The ordinal position (tenth) of the group probability $p_p$ of run lengths in portion $p_1$ is listed in Table V based on ordinal position of the value $p_p$ relative to the probability of occurrences of all other zero run lengths, portion $p_4$. The value $p_2$ represents, however, all run lengths in portion $p_1$.

A Huffman codeword, which is a statistical coding scheme, is assigned to each member of the group of zero run length values and non-zero values having a code length corresponding to their oridinal position in Table V based on the probability of occurrence of each value. In Table V, zero run lengths of portions $p_1$ and $p_4$ are listed in order of probability of occurrence. The probability of occurrence $p_p$ of any member of the run length group under portion $p_1$ of the curve p is approximately tenth in ordinal position, for this example.

The group probability $p_p$ is indicated in Table V by the word "keyword". The term keyword as used herein implies that a special code is employed for each zero run length value for all members of the group in portion $p_1$ of the curve p. In Huffman encoding, the beginning portion of any code cannot represent a complete code of any other codeword. Since the group of zero run lengths under portion $p_1$ has a group probability of occurrence which is about tenth in the list of probability of occurrence for all non-zero and zero run lengths, then a Huffman code comprising an n-bit codeword segment, in this example 5-bits, is assigned as the initial or prefix portion of all members of the group under segment curve portion $p_1$, which n-bit codeword corresponds to the tenth position of Table V.

In Table V, for example, the n-bit word for the keyword group of zero run lengths is assigned a prefix code 01011. This n-bit code is termed keyword and is based on the Huffman encoding rule. Since the members of the group under portion $p_1$ of the curve p have a relatively high probability of occurrence based on the combined group probability, then a relatively shorter codeword is assigned that group than otherwise would be assigned according to Huffman encoding of the individual run lengths based on individual probabilities. This ensures that the codeword prefix portion (the Keyword) for each member of the group meets the Huffman encoding rule. Since the first five digits of the codeword of each member of this relatively large group of codewords is the same Huffman codeword, then no other complete five digit code of any of the other codewords is included in the initial portion of the codeword comprising the keyword.

However, the problem remains as to assigning a different codeword for each member of the relatively large group of run lengths in the portion $p_1$ of curve p. The way this is done is to assign an additional code to be used as a suffix after the n-bit keyword. Since 35 run lengths in this example are represented by specific individual codewords, there remains 204 codewords to be assigned each of the zero run lengths in portion $p_1$. It is known that assigning a different binary number to each member of a 204 member group will result in an 8-bit code. This 8-bit code is created by ordinally counting the number of zero run length members in the portion p' and assigning each member a binary coded number corresponding to the zero count of that member. Thus, a separate, different, unique 8-bit code can be assigned each member of the zero run length group under portion $p_1$ of the probability curve p. That 8-bit code is added as a suffix to the n-bit keyword described above producing an m-bit codeword, e.g., a 13-bit codeword. A different 13-bit codeword is assigned each of the 204 members and is represented by the codeword $01011x_1 \ldots x_n$ in Table V. Any randomly occurring member of the keyword code group has a probability of occurrence which is tenth in ordinal position in Table V as compared to the codewords of all of the non-zero values and remaining run length values of portion $p_4$.

Additional reserved and special codes are illustrated in Table III. A codeword having a length 10 is assigned a marker 1 signal to indicate the beginning of a horizontal line in a video signal. A second marker signal marker 2 is assigned a code having a code length of 10-bits for indicating the initialization of a frame. A third code is assigned a code length of 7-bits which represents the 240 zero run length of FIG. 4 at peak p'. Because the probability of the 240 zero run length is relatively high in the order of occurrence of probabilities, it is assigned a unique code in the Huffman encoding rule based on ordinal position of probabilities in Table V.

Returning to FIG. 2, a horizontal drive signal is applied through a buffer 221 to switch 230 to select a marker 1 codeword which is applied to ROM 200 through switch 230. The marker may be generated for each line or a set of lines. A vertical drive signal is applied via buffer 223 to switch 230 for selecting marker 2. Marker 2 indicates the start of a frame. When the marker 2 address (codeword) of Table III is selected, that address is applied through switch 230 to the ROM 200. The marker address indicates to the receiver synchronization information at the beginning of a frame and at the beginning of certain lines to resynchronize the receiver with the transmittor should data be occasionally lost during transmission as might occur during certain atmospheric conditions or the like.

Figure 5:
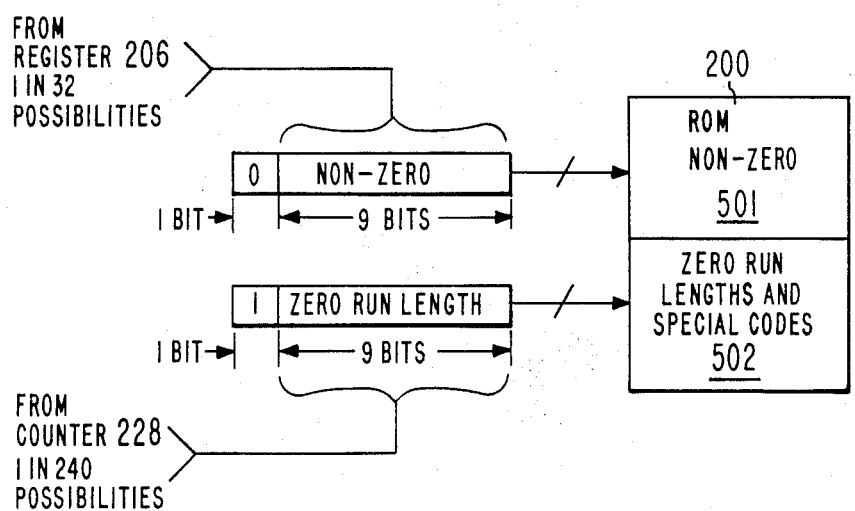
FIG. 5 is a block diagram useful in explaining a portion of the logic of FIG. 2.

In FIG. 2, ROM 200 thus includes one dictionary table comprising the information of Tables I, II and III. In FIG. 5, one example of ROM 200 is shown in which the table of non-zero values are assigned a first section 501 of ROM 200 and the zero run lengths and special codes are assigned a second section 502 of ROM 200. The non-zero table in section 501 is addressed by a 10-bit code comprising a 9-bit non-zero code representing the 9-bit non-zero value of the information signal with a one bit address code, for example, binary zero for addressing the ROM section 501. The zero run length section 502 is addressed by a 9-bit code representing the 9-bit zero run length count with a one bit address binary one added. The 9-bit zero run length address for section 502 comprises the keyword code as a prefix to the actual binary count of zeros in a given run length. The way these addresses are generated is shown in FIG. 2.

In FIG. 2, a 9-bit information signal representing a non-zero or zero value of a given pixel is applied to register 202. The output of register 202 appears on conductor 204 and is applied to register 206 and to an AND gate 208. The output of register 206 is applied to a second AND gate 210. The outputs of gates 208 and 210 are binary 0 and 1 values in accordance with the pixel information signal value applied to registers 202 and 206. If a given pixel on line 26 applied to register 202 has a zero value, then the output of gate 208 will be a zero. If the pixel value on conductor 26 applied to register 202 is non-zero value, then the output of gate 208 will be a logical 1. That is, gate 208 tests the input signal to register 202 as being a zero or non-zero value and the gate 208 output signal has a logical value representing either the zero or non-zero level. When the pixel information signal in register 202 is applied to gate 208, it is also applied to register 206 and a new pixel information signal is applied on conductor 26 to register 202, at the next clock edge. The information signal in register 206 is applied to gate 210, which like gate 208, has an output logical level of zero or one, depending upon whether the information signal in register 206 represents a respective pixel value of zero or non-zero. Thus, the outputs of gates 208 and 210 represent the zero and non-zero values of successive pixels applied from conductor 26 to register 202. The output of gate 208 is applied through inverter 212 to AND gate 214, through inverter 216 to AND gate 218 and as inputs to AND gate 220 and AND gate 222. The output of AND gate 210 is applied as an input to AND gate 214, as an input to AND gate 218 through inverter 224, as an input to AND gate 220 through inverter 226 and as in input to AND gate 222.

The output of AND gate 214 is applied to the reset input of counter 228 and as an input to switch 230 through OR gate 232. The output of gate 214 is also applied as clock inputs to register 234 and to first in first out (FIFO) registers 236 and 238 and counter 240 through OR gate 242. The output of AND gate 218 is applied to the count input of counter 228 and as an input to AND gate 233 via conductor 231. AND gate 233 has a second input from the horizontal drive (HD) sync signal. The output of gate 233 is applied to switch 230 via OR gate 235. The output of AND gate 220 is applied as an input to switch 230 via OR gate 232 and as a clock input via OR gate 242 to registers 234, 236 and 238 and counter 240. The output of AND gate 222 is applied as an input to switch 230 through OR gate 232 and as a clock input via OR gate 242 to registers 234, 236 and 238 and counter 240. Switch 230 is representative of more complex eletronic devices such as mixers which perform the actual switching which may use tri-state elements to perform the actual switching. Such more complex switches are well known.

Gates 208, 210, 214, 218, 220, 222 and inverters 212, 216, 224 and 226 provide a logical control function based on the logical values of the output signals on gates 208 and 210 in accordance with the truth table of Table VI. In Table VI the AND gates listed on top of the table have the logical values listed therebeneath. Thus, when gates 208 and 210 outputs are zero, gate 218 output is a logical 1. Similarly when gate 208 output is zero and gate 210 is a logical 1, gate 214 output is a logical 1, and so forth.

From Table VI, observe that two successive pixels each having a zero value produces ouptuts on gates 208 and 210 of zero. These outputs produce a logical 1 output on gate 218 which cause counter 228 to count zeros. Thus, as long as zeros are produced by incoming pixels at register 202, the gate 208 output will remain zero and the counter 228 will continue to count such zeros.

Should a pixel have a non-zero value, and that non-zero value is received in register 206, gate 210 will have a logical 1 output. Assuming that the next succeeding pixel received by register 202 has a zero value, the output of gate 208 is a zero causing gate 214 to output a logical 1. This logical 1 is applied to counter 228 and sets the counter to 1 to count the zeros. The initial count of counter 228 is 1. If the next succeeding pixel has a non-zero value, then the outputs of gates 208 and 210 will appear as shown in Table VI wherein gate 220 will have a logical 1 output. A logical 1 in the output of gate 220 is applied to the switch 230 which outputs the count in counter 228 as a 10-bit code to ROM 200. That 10-bit code is as described above in connection with FIG. 5. Recall that one bit of the 10 bit code addresses the zero section 502 of ROM 200 and that the remaining 9 bits of the address represents the 9-bit count value of the zero run information signal. This 10-bit address is applied to ROM 200. That address selects the corresponding codeword in ROM section 502, FIG. 5, as set forth in the zero run length table, Table II, or a keyword run length as set forth in Table IV. Thus, the corresponding codeword of Tables II and IV are selected in accordance with the address applied to ROM 200 through switch 230.

Assuming the next successive pixel information signal also is a non-zero value, the outputs of gates 208 and 210, Table VI are both logical 1's. This causes gate 222 to output a logical 1. This signal is applied through gate 232 to switch 230 to select the output of register 206 as an address to be applied to ROM 200. At this time, the tenth bit of the address selects section 501 of ROM 200 which is the non-zero table, Table I. At this time, recall that the pixel information in register 206 was formerly in register 202 when switch 230 was activated by the output of gate 220. When a signal from gate 222 activates switch 230, the information signal in register 206 now represents a new 10-bit code which is applied as an address to ROM 200 through switch 230. Register 206 output is selected by switch 230 when the output of gate 232 is high. That address applied from register 206 corresponds to the codeword in the table of ROM 200 represented by the non-zero pixel information signal value in register 206. Should the next pixel signal information have a zero value, then the information signals in registers 202 and 206 will appear as shown in Table VI wherein the output of gate 214 is a logical 1. This sets counter 228 in position to count zeros. However, gate 232 output is also high, causing the binary signal in register 206 to be applied as the address to ROM 200.

Assuming the following pixels are all zero values, counter 228 counts such zeros. In the case of run lengths of 240 zeros or more, the switch 230 needs to be switched to indicate the end of a count since the counter 228 automatically resets at the end of a 240 zero count. However, if the following line continues with zeros, the output of gate 218 will remain high and the switch 230 needs to switch that count information into the ROM 200 before the counter resets. To do this, the count signal is applied on conductor 231 through AND gate 233 to OR gate 235 to switch 230. A horizontal drive signal is applied as a second input to gate 233. The horizontal drive signal occurs at the beginning of each scan line or the beginning of each 240 zero run length if a scan line comprises all zeros. When the horizontal drive signal is applied to gate 233, gate 218 is outputting a high indicating zeros are being counted, a signal is generated which causes switch 230 to switch the count out of counter 228 into the ROM 200. The horizontal drive signal at gate 233 is applied once each line and thereafter the counter will start the recount when its 240 count is loaded in ROM 200.

The counter 228 at the end of 240 counts, automatically resets to counting zeros again for the next scan line and continues to count zeros until a non-zero value is generated. Such a non-zero value when generated will produce logical 1 on the output of gate 220. This level causes the switch 230 to output the count in counter 228 to the ROM 200 and address the table in the ROM 200 to select the code corresponding to that zero run length count.

The output of ROM 200 through register 234 is applied on conductors 246 and 248. Conductor 246 can receive a maximum of M bits in parallel to carry at least the 13 bit codeword of the keyword zero run length codes. Conductor 248, which represents a K conductor cable for carrying a K bit code, carries the code length information indicating the code length of the code appearing on conductor 246. Thus, ROM 200 stores two sets of information in its table, the codewords and the length of those codewords. The information representing a codeword and its length is applied to register 234 upon receipt of a clock signal through gate 242, recalling that the clock signal is applied in response to a logical 1 at any of gates 214, 220 and 222. A codeword is latched into register 234 whenever a non-zero value occurs at the outputs of either of gates 208 and 210.

A clock signal applied to register 234 is also applied to FIFO registers 236, 238 and counter 240. The output of FIFO register 236 is applied to parallel-to-serial converter 250. The clock signal applied to FIFO registers 236 and 238 clock the code words therefrom into the parallel-to-serial converter 250 and counter 240, respectively. FIFO 238 receives codeword length whereas FIFO 236 receives the codeword corresponding to that length. The output of FIFO 238 is applied to counter 240 to create a parallel-to-serial clock signal on conductor 252 to indicate to the parallel-to-serial converter 250 the code length of the codeword outputted on conductor 29. That codeword on conductor 29 is applied to the buffer 30, FIG. 1. The output of counter 240 on conductor 252 represents the code length information in register 234. The counter 240 output clocks the parallel-to-serial converter 250 so that the proper code length of the given codeword is outputted to conductor 29.

While the keyword codes of the special case zero run lengths may be selected as a group at a higher frequency than normally selected if assigned a Huffman code in accordance with their individual frequency of occurrence along the probability curve p FIG. 4, this is acceptable. If the run lengths in portion $p_1$ were normally assigned Huffman codewords of lengths based on individual probability, then some of these run lengths would have Huffman codewords shorter than the fixed lengths assigned to the entire group, the remaining Huffman codewords would have lengths greater than the fixed length of the group. In the worst case conditions, if the run lengths having frequency of occurrence of the keyword codes for those shorter length Huffman codewords of the group occur more frequently, then it is estimated that there is a 2–4% decrease in transmission efficiency as compared to assigning such keywords code lengths in normal Huffman code order.

Figure 3:
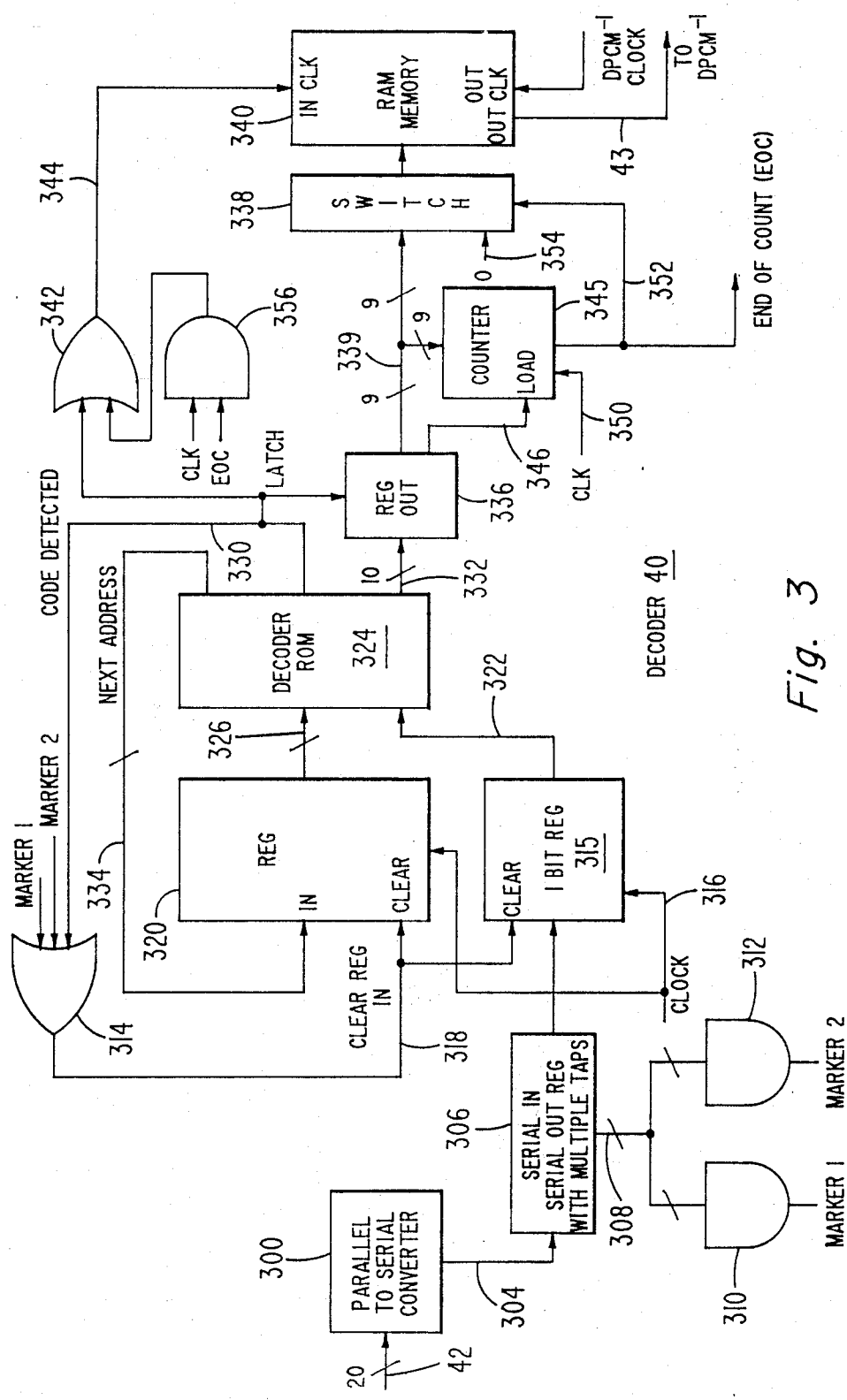
FIG. 3 is a block diagram of the decoder employed in the embodiment of FIG. 1.

In FIG. 1, decoder 40 decodes the encoded signal received from buffer 38 via conductor 42. In FIG. 3, the approach of the decoder 40 is to employ a ROM 324 in which codewords and non-codewords are stored in successively addressed memory locations. Each memory location includes a portion of the address of a successive memory location, the remaining portion comprising one bit from the received encoded signal. Successive bits of the received signal are combined with corresponding successive address portions in memory to form a search address to a new memory location. A different codeword is stored in memory at different given locations. Each location corresponds to a given sequence of binary values of the received encoded signal which in combination with that address portion relating to a given member of successive addresses in memory form a search address for a codeword. When a complete codeword is received, the ROM 324 ouputs that codeword stored at that corresponding address and the address to the ROM is reset to start a new codeword search with the next received encoded received bit.

In particular, in FIG. 3, decoder 40 includes a parallel-to-serial converter 300 which can receive a 20-bit wide signal from buffer 38 on conductor 42. The parallel-to-serial converter 300 converts the parallel bits on conductor 42 to a serial stream on conductor 304 and applies the serial stream to a serial in/serial out register 306. Register 306 has multiple taps represented by a single conductor 308. The signal on conductor 308 is applied to AND gates 310 and 312 which detect the presence of marker 1 and marker 2. The marker 1 and marker 2 signals are applied to OR gate 314. The output of serial in/serial out register 306 is applied to register 315 which is a 1-bit register sometimes referred to as a flip-flop. Register 315 receives a clock signal from a clock source on conductor 316 and a clear signal on conductor 318. The clear signal on conductor 318, received from OR gate 314, is also applied to register 320. The output of register 315 is applied via conductor 322 to the decoder ROM 324. The output of register 320 is applied on conductor 326 to decoder ROM 324. The outputs of registers 315 and 320 together form an address to ROM 324.

Register 320 is an n bit register which in this example may be 9 bits which combines with the 1 bit from register 315 to form a 10-bit address to the ROM 324. Each address in the decoder ROM 324 contains three pieces of information. One piece of information represents the data or the actual code if a code is found as represented by the information from registers 315 and 320. A second piece of information coupled with the code data is a next address code which contains the bits forming a part of the address for the next segment of the ROM to be addressed. For example, if the first memory location in ROM 324 has an address of 000, the next memory location in ROM 324 may have an address of 001 and the following memory location have an address 010, and so forth. These next addresses are binary incremented for each of the memory locations of the ROM. A third piece of information located at each ROM 324 memory location contains a binary value representing the presence or absence or a code at that address. If the data represented by the first piece of information described above represents an actual codeword, then the binary level of the third piece of information in each ROM location will be a binary value representing the existence of a codeword, for example, a binary 1. If the data portion of the ROM location does not contain an actual code, then the third piece of information assigned to that ROM location will be a binary 0 value. The ROM 324 at each memory location contains a sufficient number of bits to represent each of three pieces of information described.

Output bus conductor 334 of ROM 324 receives the next address information from the ROM memory. The conductor 330 receives a binary 1 code detection information bit (and binary 0 no code detected bit). Output bus conductor 332 receives the data portion, i.e., the codeword, in the ROM memory at a given address. The conductor 330 receives a single bit code and conductor 332 receives an n-bit preferably 10 representing the code information. The next address code applied to conductor 334 contains the address of the memory locations sequentially following the initial memory location address, which may be, for example, all zeros. The address to the ROM on conductor 334 is completed by the single bit outputted by register 315 on conductor 322. That is, the address in each memory location of ROM 324 is completed by a bit appearing on conductor 322. That one bit is formed by the sequentially occurring bits of a given received codeword processed by registers 306 and 315.

The data portion of the ROM 324 contains one of two kinds of information. The first kind of information is a code which represents all non zero code values. The second kind of information are the codewords representing binary counts of zeros in a zero run length. Not all ROM memory addresses contain true codewords in the data portion of a given memory location. The codes stored in the data portion are the codewords for the non zero values of Table I, the zero run length codewords of Table II and the codewords for the marker 1, marker 2 and 240 codes of Table III.

In operation of the decoder described so far, an encoded signal is converted to a serial stream of bits by converter 300 and is applied to serial in/serial out register 306 which applies the bits one bit at a time to 1 bit register 315. A clock signal on conductor 316 clocks the contents of register 315 via conductor 322 to ROM 324 in conjunction with clocking the contents of register 320 to form the n-bit ROM address. A signal on conductor 330 is the code detected signal which represents whether or not a code has been detected. When any of the marker 1, marker 2 or code detected signals is high, a clear signal on conductor 318 is applied to register 320 which provides a zero address to ROM 324 to address the first memory location. The marker 1 and marker 2 signals are high when the code in register 306 represents one of the marker codes. Gates 310 and 312 test the outputs of register 306 for such marker codes.

If the register 315 has a zero output on conductor 322, then the initial zero address of ROM 324 is addressed. Since the register 320 has been cleared and the register 315 has supplied only 1 bit from a codeword to the ROM 324 and since the minimum code length of Tables I, II and III is 2 for code number 1, i.e., a negative non-zero value (Table I), no codeword will have been detected by this address and ROM 324 will output a zero on the code detected conductor 330 and will output on bus conductor 334 the address of the next sequentially stored memory location in ROM 324. This next address will be clocked into register 320. In conjunction with the output of register 315, that address forms a complete address to ROM 324 at the next clock on conductor 316.

If the address comprising the bits on conductors 326 and 322 do not represent a codeword, then the next additional memory location in ROM 324 will output a lack of a code detection signal on conductor 330, that is a binary zero value, and also a next address on bus conductor 334. Whether or not a code is detected is known a priori by the combination of a given address and the output of register 315. Each given memory address in combination with the known code bit output of register 315 can be determined to constitute a codeword. If that combination is known to form a codeword, then that complete address will address that memory location containing that codeword. Thus, a given number of circular cycles of next address in combination with a given output level from register 315 represents a codeword. At the next clock signal on conductor 316, the next address on conductor 334 and the next bit in the encoded signal from register 306 are clocked to address ROM 324. If these combination of bits on conductors 326 and 322 represent a codeword, for example a zero or non-zero value, then the ROM 324 will output a code detected signal, a binary 1 value on conductor 330, which clears register 320 and will output on bus conductor 332 the n-bit codeword representing that detected code value corresponding to that address.

That n-bit codeword on conductor 332 is applied to register 336 and assuming a code was detected, the binary 1 code detected signal on conductor 330 is applied to register 336 to latch a code on conductor 332 from register 336 to output conductor 339 or 346, depending on whether a non-zero or zero run length value was detected. The n-bit codeword on conductor 332 includes a bit indicating whether a non-zero value or a zero run length value has been detected in a manner similar to that discussed above in connection with ROM 200, FIG. 5. Assuming a non-zero value is detected then the latch signal representing the code detected binary 1 value on conductor 330 latches the code on conductor 332 into register 336 and applies that code to switch 338 via conductor 339. The code is latched into memory 340 by the code detected signal on conductor 330 and applied to the clock input of memory 340 via OR gate 342 and conductor 344. The code is clocked out of the memory 340 (FIG. 1) and applied via conductor 43 to loop 44 upon receipt of a DPCM loop clock from DPCM loop 44.

If the most significant bit of the detected code on conductor 332 is a zero, a zero run length value has been detected and if a one, a non-zero value has been detected. The data in ROM 324 represents, for zero run length codewords, the binary representation of the number of zeros in that run length. If a zero run length is detected, then register 336 will be latched by the code detected signal on conductor 330 to load the binary representation of the number of zeros in a given run length into the counter 345. The clock signal on conductor 350 causes counter 345 to countdown and apply the countdown signal on conductor 352 to switch 338. Switch 338 is then caused to select zeros on conductor 354 and apply those zeros to memory 340. While the counter 345 is counting down the number of zeros in a given run length, each count of counter 340 causes a zero to be loaded into memory 340. When the counter 345 reaches the end of the count, the end of the count (EOC) signal is applied on conductor 352 to switch off zeros from conductor 354. The end of count (EOC) signal is also applied to AND gate 356.

AND gate 356 has a second input comprising a clock signal and upon receipt of the end of count (EOC) signal from counter 345 applies a clock signal to OR gate 342 whose output causes memory 340 to output the zeros stored in memory 340. The number of zeros in any of the ranges of Tables II and IV is applied to the inverse DPCM loop via conductor 43 upon receipt of a DPCM clock signal.

Whenever the next address on conductor 334 represents a lack of code being detected in ROM 324, the code detected signal on conductor 330 is a low and no latch signal is applied to register 336 or memory 340. In this way, register 336 is not latched and any information on conductor 332 is not applied to switch 338 or counter 345. If the next address location in ROM 324 also does not contain a code, the next bit in the serial input signal applied to 1 bit register 315 is added to the next address from ROM 324 to provide a new address to the next ROM location.

For example, if two zeros in a row are received from register 315 that indicates a non zero value codeword has been received from Table I. Those two zeros in combination with the sequence of next addresses appearing on conductor 334 cause the ROM memory location to output value −7 represented by the codeword 00 and indicate on conductor 330 a code has been detected. When the code is detected, a 10 bit value on conductor 332 is outputted from ROM 324 representing the value of that detected codeword, that is the actual non-zero value of Table I. Register 336 contains two groups of information: run length and non-zero values. Depending on the code applied to conductor 332 by ROM 324, a bit in register 336 represents whether or not a run length or non-zero value has been detected and that bit is supplied on conductor 346. That bit on conductor 346 determines whether the counter 345 should receive the encoded run length information from conductor 336 or not. If not, the switch 338 applies the latched code from register 336 directly to memory 340. The end of count (EOC) signal on conductor 352 is a binary 1 when the counter 340 counts and has a zero value when the counter is not counting. When the counter is not counting, this implies a non-zero value exists in register 336 and the signal on conductor 352 causes register 336 to output its contents via switch 338 into ROM 340.

In the claims, the term "value" and "condition" are intended to represent different conditions or states of the signal. For example, "value" or "condition" can represent zero or non-zero values, or run length magnitudes or, for example, different zero or non-zero run lengths or other conditions manifested by a given signal.

What is claimed is:

1. A statistical encoder for encoding a digitized signal for transmission over a channel, said signal comprising a plurality of different conditions, each condition having a different frequency of occurrence in said signal, said encoder comprising:

first means responsive to said signal for generating a first set of codewords, each representing a different signal condition lying in a range of frequencies of occurrences, the codewords having lengths such that the less frequently occurring words generally are longest and the most frequently occurring words generally are shortest;

second means responsive to said signal for generating a second set of codewords, each word of said second set of words representing a signal condition whose frequency of occurrence is less than the frequency of occurrence of said less frequently occurring words, said second set comprising a number of members whose combined frequency of occurrence is statistically organized in a certain order with said range of frequencies of occurrences, each codeword of said second set including a common codeword portion of a length which is statistically based on said combined frequency of occurrence relative to said range of frequencies of occurrences; and third means for causing said codewords of said first and second sets to be generated in accordance to the frequency of occurrence of the corresponding conditions of said signal.

2. The encoder of claim 1 wherein said digitized signal is a difference signal produced by a predictive system.

3. The encoder of claim 1 wherein said first and second means include means for generating said first and second sets of codewords from one table wherein said second set comprises codewords having a prefix code assigned according to said statistical certain order and a suffix code assigned according to a non-statistical order.

4. The encoder of claim 3 wherein said statistical order is based on the ordinal position of the combined frequency of occurrence of the second group as compared to the frequency of occurrence of the codewords of the first group.

5. The encoder of claim 4 wherein the members of the second group have fixed length codewords.

6. The encoder of claim 1 wherein said first set of codewords represent non-zero values and more likely to occur zero run lengths of said digitized signal and said second set of codewords represent less likely to occur run lengths of zero value of said signal.

7. Apparatus for encoding a digitized signal for transmission over a channel, said signal comprising a plurality of different values, each value having a given probability of occurrence in said signal, said apparatus comprising:

memory means for grouping a plurality of different codewords of different codelengths into first and second groups, each codeword representing a different signal value, said first group of said codewords being organized in a first given order in which at least generally the shortest codeword length manifests that signal value having the greatest probability of occurrence and the greatest codeword length at least generally manifests that signal value having the lowest probability of occurrence, said second group of different codewords comprising a prefix keyword and a suffix code, each codeword being of a given codelength, said prefix keyword of said second group having a length such that the combined probability of occurrence value of all of the signal values represented by the second group is organized with said first given order generally according to said combined probability value regardless the relative codeword length of said second group including the prefix and suffix codes as compared to the codeword length of the next adjacent codes of the first group; and first means responsive to successive values of said digitized signal applied as an input thereto for selecting from said memory means to output respective codewords descriptive of said digitized signal.

8. The apparatus of claim 7 wherein said memory means includes means for organizing the first and second groups so that said combined probability value is significantly smaller than the combined probability of occurrence of all of the signal values represented by the first group, and is higher than the probability of occurrence of each codeword of a certain portion of the first group.

9. The apparatus of claim 7 wherein said memory means includes means arranged so that said first group is organized in a given assigned statistical code order and said second group is organized in codewords of certain lengths, the initial n bit keyword length portion of each codeword of the second group comprising an assigned codeword of the given statistical code order generally according to the combined probability of occurrence of the signal values of said second group in said given statistical order.

10. The apparatus of claim 7 wherein said first means includes second means for generating an n-bit code representing the detection of a member of said first and second groups of signal values, third means responsive to the detection of a member of the first group for applying said digitized signal representing said first group member as an address to said memory means, fourth means in response to the detection of a member of the second group for determining the run length value of said detected member of the second group and using the determined run length as an address to said memory means.

11. The apparatus of claim 7 wherein said first means includes first logic means for detecting a non-zero level in said digitized signal and a second logic means for detecting a zero level in said digitized signal, and means responsive to said first and second logic means for causing the non-zero level to access the memory means and for counting the zero levels and causing the zero count to access the memory means to generate said output codeword.

12. The apparatus of claim 7 wherein said memory means includes means arranged so that said first group represents non-zero values and more likely to occur run lengths of zero values for said signal and said second group represents less likely to occur run lengths of zero values for said signal.

13. A statistical encoder for encoding a digitized signal for transmission over a channel, said signal comprising a plurality of different conditions, each condition having a different frequency of occurrence in said signal, said encoder comprising:

first means responsive to said signal for generating a first set of codewords, each representing more commonly occurring zero run length values and non-zero values; the codewords having lengths according to a statistical rule such that the at least generally less commonly occurring words are longest and the at least generally most commonly occurring words are shortest; and second means responsive to said signal for generating a second set of codewords, each word of said second set of words representing less commonly occurring zero run length values, the codewords of the second set each comprising the same prefix keyword code having a length assigned according to the statistical rule with said first set of codewords and a suffix of such length that the prefix and suffix together have length outside said statistical rule 14. Apparatus for encoding a digitized signal for transmission over a channel, said signal comprising a plurality of different conditions, each condition having a given frequency of occurrence in said signal, said apparatus comprising:

first means for grouping, for a first given number of members, a first plurality of codewords representing a first plurality of signal conditions, each codeword representing a different condition, according to a first range of frequencies of occurrence of the condition of said signal, said first plurality comprising codewords of differing lengths, the shortest codeword occurring most frequently, the largest codeword occurring least frequently; and second means for grouping, for a second given number of members, a second plurality of codewords representing a second plurality of signal conditions, each second plurality of codeword representing a different condition according to a second range of frequencies of occurrence of the conditions of said signal, the second range of frequency of occurrence having a combined frequency of occurrence lying in the first range, all said codewords of said first and second pluralities being different, each codeword of the second plurality having a common codeword portion length which is statistically based on said combined frequency of occurrence relative to said first range.

15. The apparatus of claim 14 wherein said signal conditions represents run length values zero and non-zero values, said apparatus including means for generating an n-bit code signal representing non-zero values and zero run length values and means responsive to said n-bit code signal to cause said first and second means to generate a codeword corresponding to the non-zero value and zero run length value.

16. The apparatus of claim 14 wherein each signal condition represents zero and non-zero values, said apparatus further including address means for accessing said first and second means with an address code comprising the digital values of said signal.

17. The apparatus of claim 14 including switch means for applying an address signal to said first and second means to output a codeword corresponding to the condition of said signal and n-bit code means responsive to said digitized signal for counting run lengths representing one condition in said digitized signal and for determining the conditions of said signal other than the one condition for generating a switch signal for operating said switch means.

18. A method for encoding a digitized signal for transmission over a channel, said signal comprising a plurality of different conditions, each condition having a given probability of occurrence in said signal, said method comprising:
grouping a plurality of different codewords of different codelengths into first and second groups, each codeword representing a different signal value, a first group of said codewords being organized statistically in a first given order in which at least generally the shortest codeword length manifests that signal condition having the greatest probability of occurrence and at least generally the greatest codeword length manifests that signal condition having the lowest probability of occurrence;
a second group of different codewords having a codeword portion length such that the combined probability of occurrence value of all of the signal conditions represented by the second group is organized statistically with said first given order codeword length based on said combined probability value regardless the relative codeword lengths of said second group codewords as compared to the codeword length of the next adjacent codewords of the first group; and
causing a memory means in response to the conditions of said digitized signal applied as an input thereto to output that codeword corresponding to the input digitized signal condition.

19. The method of claim 18 wherein said grouping includes organizing the first and second groups so that the combined probability value of the second group is significantly smaller than the combined probability of occurrence of all of the signal values represented by the first group and is higher than the probability of occurrence of each codeword of a certain portion of the first group.

20. The method of claim 18 wherein said grouping includes grouping the first group into a plurality of codewords representing more likely to occur run lengths of zero values and non-zero values and grouping the second group into a plurality of codewords representing less likely to occur zero run length values.

21. A method for encoding a digitized signal for transmission over a channel, said signal comprising a plurality of different values, each value having a given frequency of occurrence in said signal, said method comprising:
grouping a first plurality of codewords representing a first plurality of signal values, each codeword representing a different value, according to a first range of frequencies of occurrence of the values of said signal, said first plurality comprising codewords of differing lengths according to a statistical rule, wherein the shorter codewords generally occur more frequently and the longer codewords generally occur less frequently; and
grouping a second plurality of codewords representing a second plurality of signal values, each second plurality of codewords representing a different value, according to a second range of frequencies of occurrence of the values of said signal, the second range of frequency of occurrence having a combined frequency of occurrence statistically lying in the first range, the codewords of the second group each having the same codeword portion of a length according to said statistical rule and a total length differing from said statistical rule.

22. The method of claim 21 wherein said grouping of the second plurality of codewords values includes assigning codewords of m-bits to the second plurality of codewords codes whose prefix n-bit portion falls within the statistical rule and whose remaining suffix m-n bit portion falls outside said statistical rule.

23. The method of claim 21 wherein the first plurality grouping step includes grouping the most likely to occur zero run length values and non-zero values into said first plurality of codewords and said second plurality grouping step includes grouping the less likely to occur zero run length values.

* * * * *

(12) EX PARTE REEXAMINATION CERTIFICATE (9061st)
United States Patent
Fedele

(10) Number: US 4,813,056 C1
(45) Certificate Issued: Jun. 12, 2012

(54) MODIFIED STATISTICAL CODING

(75) Inventor: Nicola J. Fedele, Kingston, NJ (US)

(73) Assignee: Princeton Digital Image Corporation, Longview, TX (US)

Reexamination Request:
No. 90/011,856, Aug. 11, 2011

Reexamination Certificate for:
Patent No.: 4,813,056
Issued: Mar. 14, 1989
Appl. No.: 07/130,379
Filed: Dec. 8, 1987

(51) Int. Cl.
*H04B 14/06* (2006.01)

(52) U.S. Cl. .................. 375/246; 341/107; 375/240; 375/E7.202; 375/E7.244

(58) Field of Classification Search .................. None
See application file for complete search history.

(56) References Cited

To view the complete listing of prior art documents cited during the proceeding for Reexamination Control Number 90/011,856, please refer to the USPTO's public Patent Application Information Retrieval (PAIR) system under the Display References tab.

*Primary Examiner* — Salman Ahmed

(57) ABSTRACT

A ROM includes a single dictionary of variable length codewords wherein Huffman codewords are assigned all members of the dictionary set, including one key codeword being assigned as a prefix codeword segment for a relatively large subgroup of the set, based on the combined probability of occurrence of the subgroup as compared to the individual probabilities of occurrences of the remaining members of the dictionary set. The key codeword is an indication of a departure from straight-forward Huffman coding, to prepare an alternative coding scheme for developing a longer codeword which uses the key codeword as a prefix portion of that longer codeword. A unique suffix codeword segment follows the key codeword prefix for particularly identifying each member of the subgroup. The combined probability of occurrence of a member of the subgroup is higher than the probability of occurrence of codewords of shorter length, but the individual probabilities are significantly lower. The subgroup members can be assigned codeword lengths significantly shorter than codewords that would be assigned in straightforward Huffman coding.

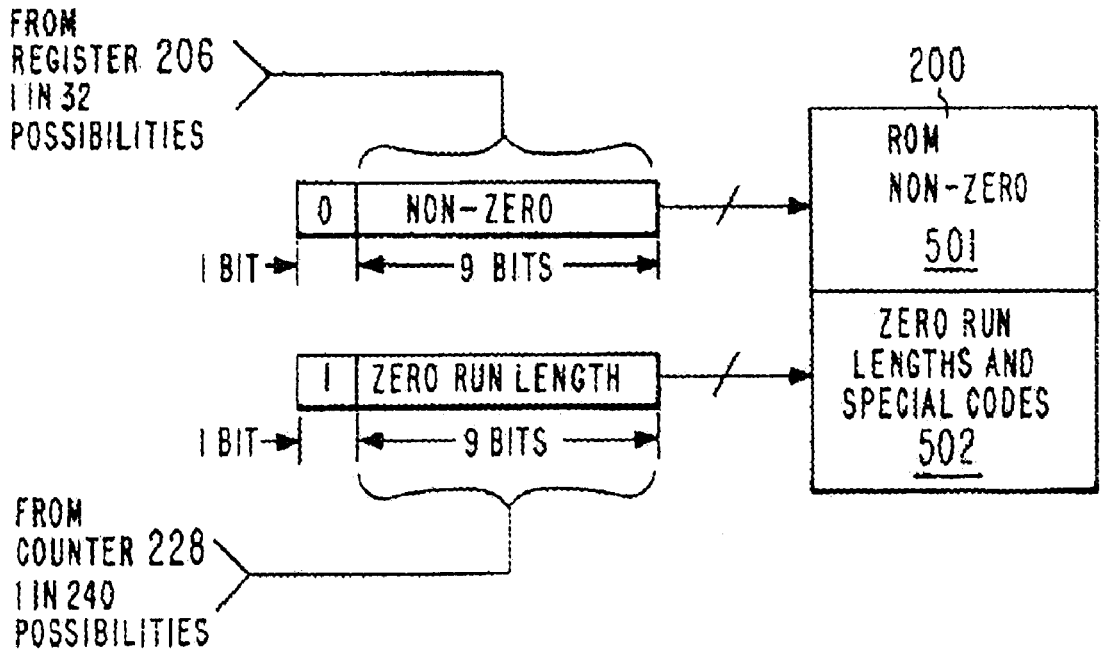

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 13, 14, 18, 20, 21 and 23 is confirmed.

Claims 1-12, 15-17, 19 and 22 were not reexamined.

* * * * *